(12) United States Patent
Ohbayashi et al.

(10) Patent No.: US 6,891,743 B2
(45) Date of Patent: May 10, 2005

(54) SEMICONDUCTOR MEMORY DEVICE HAVING A CAPACITIVE PLATE TO REDUCE SOFT ERRORS

(75) Inventors: Shigeki Ohbayashi, Tokyo (JP);
Yoshiyuki Ishigaki, Tokyo (JP);
Takahiro Yokoyama, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 3 days.

(21) Appl. No.: 10/195,381

(22) Filed: Jul. 16, 2002

(65) Prior Publication Data

US 2003/0133335 A1 Jul. 17, 2003

(30) Foreign Application Priority Data

Jan. 17, 2002 (JP) ........................................ 2002-008663

(51) Int. Cl.$^7$ ................................................. G11C 15/00
(52) U.S. Cl. ........................ 365/149; 365/188; 365/200
(58) Field of Search ................................ 365/149, 188, 365/200

(56) References Cited

U.S. PATENT DOCUMENTS

| | | | | |
|---|---|---|---|---|
| 5,347,152 A | * | 9/1994 | Sundaresan | ................. 257/304 |
| 5,541,427 A | | 7/1996 | Chappell et al. | ............ 257/306 |
| 5,754,467 A | | 5/1998 | Ikeda et al. | |
| 5,870,341 A | * | 2/1999 | Lin et al. | ..................... 365/200 |
| 5,880,497 A | | 3/1999 | Ikeda et al. | |
| 5,963,466 A | | 10/1999 | Evans, Jr. | |
| 6,141,237 A | * | 10/2000 | Eliason et al. | .............. 365/145 |
| 6,285,575 B1 | * | 9/2001 | Miwa | ......................... 365/145 |
| 6,507,511 B1 | * | 1/2003 | Barth et al. | ................. 365/154 |

FOREIGN PATENT DOCUMENTS

| | | |
|---|---|---|
| JP | 63-16658 | 1/1988 |
| JP | 6-25199 | 9/1994 |
| JP | 6-302785 | 10/1994 |
| JP | 8-236645 | 9/1996 |

* cited by examiner

*Primary Examiner*—Richard Elms
*Assistant Examiner*—Tuan T. Nguyen
(74) *Attorney, Agent, or Firm*—McDermott Will & Emery LLP

(57) ABSTRACT

A CMOS-SRAM has a plurality of full CMOS type memory cells (1) and a capacity plate (2). The memory cells (1) are two-dimensionally arranged in the row direction and in the column direction. The capacity plate 2 adds an additional capacity to nodes ND1 and ND2 for storing data in order to reduce soft errors. The capacity plate (2) is common with the plurality of memory cells (1). The capacity plates (2) are separated by every column, that is in the row direction. The capacity plate (2) is connected to a power voltage line VDD so as to simplify the voltage supplying system. When a stand-by failure occurs in the memory cell (1) of a certain column, the memory cell (1) is replaced with a redundant memory cell.

12 Claims, 13 Drawing Sheets

SEMICONDUCTOR MEMORY DEVICE HAVING A CAPACITIVE PLATE TO REDUCE SOFT ERRORS

This application is based on the application No. 2002-8663 filed in Japan, the contents of which are hereby incorporated by reference.

BACKGROUND OF THE INVENTION

1. Field of the Invention

The present invention relates to a semiconductor memory device, more particularly to a semiconductor memory device including a capacity plate, which adds a capacity to its memory cells in order to make the semiconductor memory device strong against a soft error. Moreover, the present invention relates to a semiconductor memory device in which a failed memory cell is replaced with a redundant memory cell.

2. Description of the Prior Art

In recent years, in a semiconductor memory device such as an SRAM (Static Random Access Memory), a DRAM (Dynamic Random Access Memory) or the like, the quantity of charge for holding its memory has been gradually decreased by integration of an IC and decrease of the operating voltage of the IC. With this, such a phenomenon that held data may be easily changed (corrupt data occur) by affection of outer stresses such as cosmic rays etc. at the time of memory holding, namely, a soft error is easy to occur. Therefore, the semiconductor, which is strong against the soft error, is required.

Particularly, as to the SRAM in which a high resistance load type or TFT type memory cell is used, the tendency that the operating characteristic deteriorates is strong with reduction of power. Thus, in recent years, an SRAM, which uses a full CMOS type (bulk six transistors type) memory cell (hereinafter referred to "CMOS-SRAM"), has gradually become a main stream.

As shown in FIG. 12A, a memory cell of a CMOS-SRAM includes two n type bulk access transistors AT1 and AT2 (hereinafter referred to "access transistors AT1 and AT2" for short), two n type bulk driver transistors DT1 and DT2 (hereinafter referred to "driver transistors DT1 and DT2" for short), and two p type bulk load transistors LT1 and LT2 (hereinafter referred to "load transistors LT1 and LT2" for short).

The memory cell of the CMOS-SRAM is such that when the access transistors AT1 and AT2 are turned on by a signal which is inputted into the memory cell via a word line WL, unit information is written into or read out from first and second nodes N1 and N2 via bit lines BL and BL#. Since the CMOS-SRAM can charge the nodes N1 and N2 at the H level side by means of the load transistors LT1 and LT2, it has an advantage of excellent resistance to the soft error as compared with a high resistance type SRAM or a TFT type SRAM whose memory node has a weak charging power.

However, in the CMOS-SRAM also, the soft error has been becoming easy to occur since the stored charge (voltage×capacity) of the memory cell has been becoming smaller due to decrease of the operating voltage, integration of the device or fining of the cell size. Therefore, it is necessary to apply measures of some kind for the soft error. In addition, the soft error generally occurs by the fact that ionized electrons occur in a semiconductor substrate and near it due to outer stresses (for example, a rays or neutron rays) and thereby the ionized electrons change the charge level of H level at the nodes N1 and N2 to make the memory cell malfunction.

Hereinafter, an example of an aspect of occurrence of the soft error will be described with reference to FIGS. 12A and 12B and FIGS. 13A and 13B. FIG. 12A shows the state in which the memory cell holds a proper data. In this state, by the inverter latch, the first node N1 is held at H level (high level) while the second node N2 is held at L level (low level). In this case, the first node N1 is connected to a power voltage line VDD via the load transistor LT1 of ON state while the second node N2 is connected to a ground voltage line GND via the driver transistor DT2 of ON state.

When the charge by a rays instantaneously enters (collides) into the first node N1, as shown in FIG. 12B, the drive by the power voltage line VDD via the load transistor LT1 comes short so that the first node N1 is changed from H level to L level. When the first node N1 is changed to L level in this manner, as shown in FIG. 13A, the load transistor LT2 is turned to ON. As the result, the second node N2 is connected to the power voltage line VDD so that it is changed from L level to H level.

When the first node N1 is changed to L level, as shown in FIG. 13B, the load transistor LT1 is turned to OFF. As the result, the first node N1 is fixed to L level. Namely, it becomes the reverse state with the state shown in FIG. 12A, in which the first node N1 is held at L level while the second node N2 is held at H level, so that the error data is kept holding (soft error).

Moreover, in the semiconductor memory device such as the CMOS-SRAM, even if the memory cell can conduct memory hold operation properly, it sometimes causes a stand-by failure (stand-by current failure). Namely, for example, in the event that a slight electrical short circuit occurs in the memory cell of the CMOS-SRAM due to adhesion of debris or the like during the manufacturing process, there may occur such a phenomenon that a current flows by the slight short circuit, that is to say, a stand-by failure at the time of the stand-by mode, although it does not causes interference with memory holding operation. In this case, since the memory holding operation is properly performed, the memory cell in which the stand-by failure has occurred can be found by a normal examination prior to the shipment of the products, thereby it cannot be relieved. Therefore, there may occur such a problem that the yield is lowered. Of course, the stand-by failure is also promoted by decrease of the operating voltage or integration (fining of cell size) of the IC.

As the above-mentioned short circuit, for example, the following matters may be indicated.

(1) A short circuit between one node and the other node.
(2) A short circuit between the node and the power voltage line VDD.
(3) A short circuit between the node and the ground voltage line Vss.
(4) A short circuit between the node and the word line.
(5) A short circuit between the node and the bit line;
(6) A short circuit between the bit line and the word line.
(7) A short circuit between the word line and the power voltage line VDD.
(8) A short circuit between the bit line and the ground voltage line Vss.
(9) A short circuit between the power voltage line VDD and the ground voltage line Vss.

On the other hand, in the semiconductor memory device with a mass storage capacity, generally, in order to improve the yield, there is provided redundant memory cell, which are to be replaced with the failed memory cell which does not properly operate. When the failed memory cell is found within the semiconductor memory device, the failed memory cell is replaced with the redundant memory cell. The operation to replace the failed memory cell with the redundant memory cell is conducted, for example, by the following steps.

Namely, at first, the address of the failed memory cell is specified or designated. Then, the fuse of the failed memory cell within the redundant program circuit is cut by laser or the like. Thus, the failed memory cell is held at a normally nonselective state to be nullified. After that, the address of the nullified failed memory cell is assigned to the redundant memory cell. In consequence, the nullified failed memory cell is replaced with the redundant memory cell.

Consequently, at first, it is necessary for the semiconductor memory device such as the CMOS-SRAM to provide a structure which can reduce occurrence of the soft error regardless of decrease of the operating voltage of the IC, integration of the IC or fining of the cell size of the IC.

Thus, there has been proposed an SRAM in which the storage capacity of a memory cell is increased by adding a capacity to memory nodes so as to reduce an soft error etc (for example, see U.S. Pat. No. 5,541,427, JP No. 6-302785A, JP No. 63-16658A). However, in the conventional SRAM disclosed in each of the above-mentioned prior art documents, in which the capacity is added to the memory nodes, there has been a problem that the structure and the manufacturing process thereof is complex.

Moreover, in the semiconductor memory device such as the CMOS-SRAM or the like, even if the stand-by failure can be reduced, it is difficult to prevent this perfectly. Accordingly, it is also necessary for the semiconductor memory device to provide a structure which can easily or simply replace the failed memory cell with the redundant memory cell when the stand-by failure has occurred in the memory cell.

SUMMARY OF THE INVENTION

The present invention has been accomplished in order to solve the above-mentioned conventional problems. The present invention has an object to provide a semiconductor memory device whose structure and manufacturing process are simple, which can effectively reduce occurrence of the soft error, even if the quantity of the electric charge for memory hold is smaller due to decrease of the operating voltage of the IC, integration of the IC or the like.

Moreover, the present invention has another object to provide a semiconductor memory device which can easily or simply replace the memory cell with the redundant memory cell when a stand-by failure of the memory cell has occurred.

A semiconductor memory device according to the present invention has a plurality of memory cells and a capacity plate. The memory cells are two-dimensionally arranged in a row direction and in a column direction. Each of the memory cells may be preferably composed of a full CMOS type SRAM or the like. The memory cell stores unit information in its memory node. The capacity plate produces a capacity to make the semiconductor memory device strong against its soft error. The capacity plate is common with the plurality of memory cells lining up in the column direction while being separated by every column.

In the semiconductor device, even if the quantity of the electric charge for holding memory is small due to decrease of the operating voltage and integration of the IC, occurrence of the soft error may be effectively reduced. In addition, interconnection structure to supply constant voltage to the capacity plate and the manufacturing process thereof may be simplified. Moreover, by replacing the memory cell having the stand-by failure with the redundant memory cell, a stand-by failure may be relieved while the yield may be increased considerably.

When the stand-by failure occurs in the memory cells lining up in the column direction, it is preferable that a capacitive conductive film of the capacity plate is connected to a power voltage section while the memory cells are switched by a cell redundant signal to be replaced with redundant memory cells. Alternatively, the capacitive conductive film of the capacity plate may be connected to a ground voltage section. In that case, the memory cell may be easily or simply replaced with the redundant memory cell when the stand-by failure of the memory cell has occurred. Thus, the yield may be improved.

BRIEF DESCRIPTION OF THE DRAWINGS

Various characteristics and advantages of the present invention will become clear from the following description taken in conjunction with the preferred embodiments with reference to the accompanying drawings throughout which like parts are designated by like reference numerals, in which:

FIG. 1A is a plan view of a memory cell of a CMOS-SRAM according to Embodiment 1 of the present invention while

FIG. 4A is a plan view of the CMOS-SRAM in which the memory cells shown in FIG. 1A are two-dimensionally arranged while

FIG. 5A is an equivalent circuit diagram of the CMOS-SRAM shown in FIG. 4B while

DETAILED DESCRIPTION OF THE PREFERRED EMBODIMENTS (Embodiment 1)

Figure 1A:
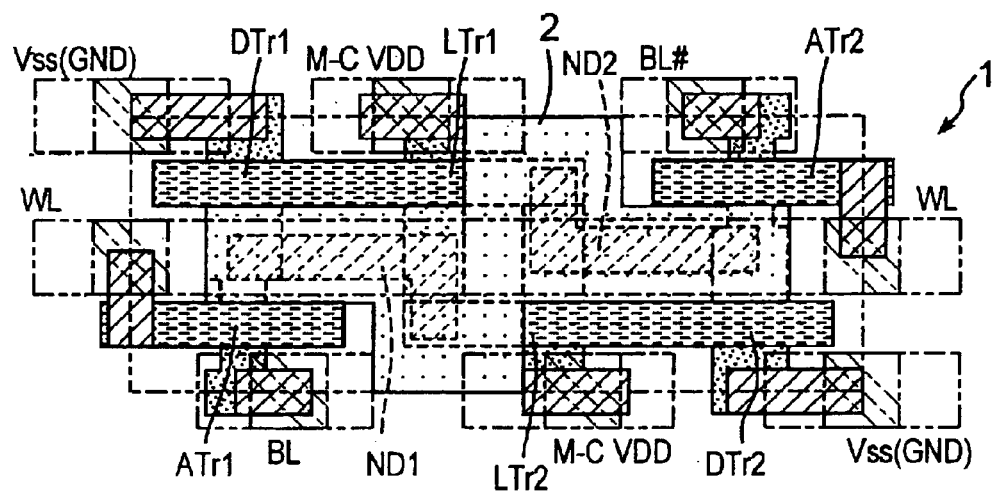
Figure 1B:
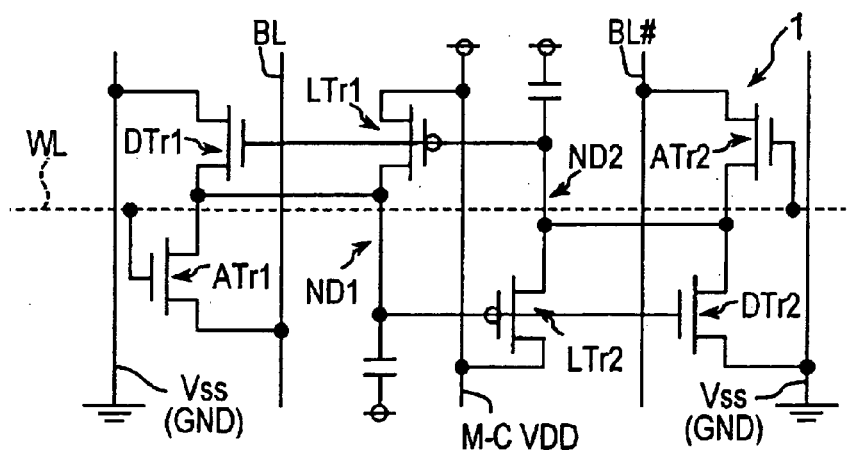
FIG. 1B is a circuit diagram of the memory cell shown in FIG. 1A.

FIG. 1A is a plan view showing a layout structure of a memory cell constituting a CMOS-SRAM (SRAM including full CMOS type memory cells) which has a capacity plate according to the present invention. FIG. 1B is a circuit diagram showing an electric connection configuration of the memory cell shown in FIG. 1A. FIGS. 2A–2C and FIGS. 3A and 3B are plan views in which the memory cell shown in FIG. 1A are divided into layers from the lower side to the upper side, respectively. Hereinafter, as a matter of convenience, in the locative relation in FIGS. 1A to 3B, the right side and the left side are referred to "right" and "left", respectively. Also, the near side and the far side are referred to "front" and "rear", respectively.

As shown in FIGS. 1A and 1B, a memory cell 1 is provided with a capacity plate 2, first and second n type access transistors ATr1 and ATr2, first and second n type driver transistors DTr1 and DTr2, first and second p type load transistors LTr1 and LTr2, and first and second nodes ND1 and ND2.

Hereupon, the first node ND1 is connected to each of the drains of the first driver transistor DTr1 and the first load transistor LTr1, each of the gates of the second driver transistor DTr2 and the second load transistor LTr2 and the drain of the first access transistor ATr1. On the other hand, the second node ND2 is connected to each of the drains of the second driver transistor DTr2 and the second load transistor LTr2, each of the gates of the first driver transistor DTr1 and the first load transistor LTr1 and the drain of the second access transistor ATr2.

Each of the gates of the both access transistors ATr1 and ATr2 is connected to the word line WL. The source of the first access transistor ATr1 is connected to the bit line BL. The source of the second access transistor ATr2 is connected to the bit line BL# which is complementary with the bit line BL. Each of the sources of both load transistors LTr1 and LTr2 is connected to the power voltage line M-CVDD. Each of the sources of the both driver transistors DTr1 and DTr2 is connected to the ground voltage line Vss (GND).

Figure 2A:
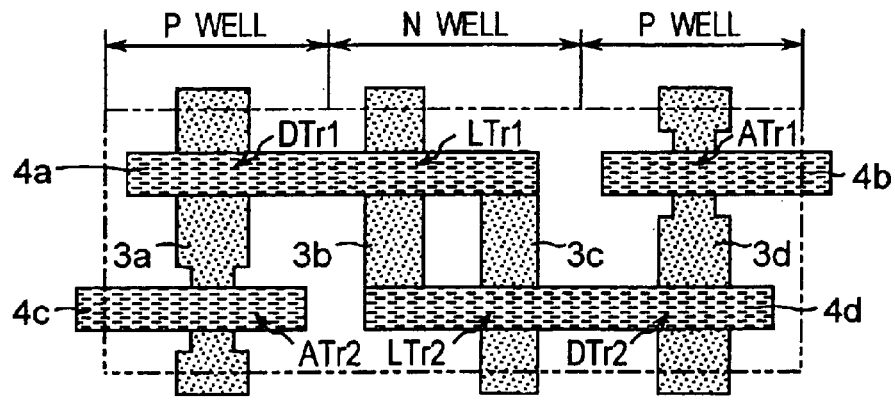
FIGS. 2A–2C are plan views showing the structures of the lowermost layer, and the second and third layers from the lower side of the memory cell shown in FIG. 1A, respectively.

FIG. 2A shows the lowermost layer of the memory cell 1. As shown in FIG. 2A, this layer of the memory cell 1 is provided with four active layers 3a–3d and four gate interconnects 4a–4d arranged on these active layers 3a–3d. Then, the above-mentioned transistors ATr1, ATr2, DTr1, DTr2, LTr1 and LTr2 are formed on these active layers 3a–3d and gate interconnects 4a–4d.

Hereupon, at the rear portion of the memory cell 1, the first driver transistor DTr1, the first load transistor LTr1 and the second access transistor ATr2 are arranged linearly from the left side to the right side. At the front portion of the memory cell 1, the first access transistor ATr1, the second load transistor LTr2 and the second driver transistor DTr2 are arranged linearly from the left side to the right side.

In the above-mentioned arrangement, the first driver transistor DTr1 and the first load transistor LTr1 have the same electric potential by means of the gate interconnection 4a. Then, the second driver transistor DTr2 and the second load transistor LTr2 have same electric potential by means of the gate interconnection 4d. Moreover, the two gate interconnections 4b and 4c form the second access transistor ATr2 and the first access transistor ATr1, respectively.

Figure 2B:
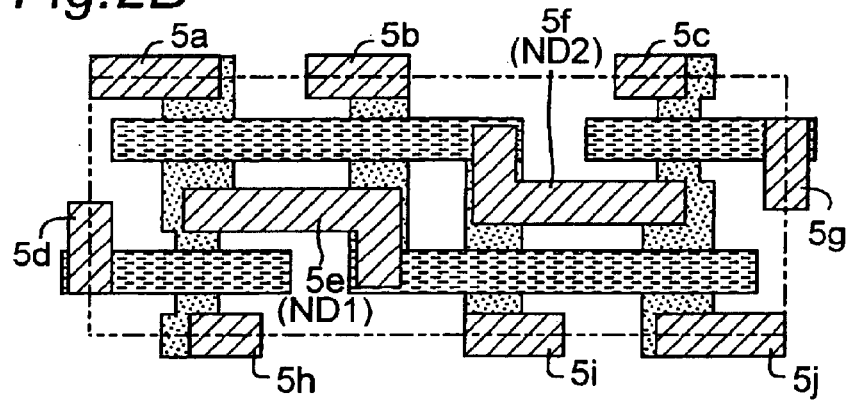

FIG. 2B shows the second layer from the lowermost layer of the memory cell 1. As shown in FIG. 2B, this layer of the memory cell 1 is provided with ten tungsten damascene layers 5a–5j (hereinafter referred to "damascene layers 5a–5j" for short) formed by means of the tungsten damascene process. Hereupon, two damascene layers 5e and 5f form the first node ND1 and the second node ND2, respectively. Other damascene layers 5a–5d and 5g–5j are interconnections for connecting each of the transistors ATr1, ATr2, DTr1, DTr2, LTr1 and LTr2 to the word line WL, the bit line BL, the bit line BL#, the power voltage line VDD and the ground voltage line Vss (GND) respectively.

Specifically, the damascene layer 5a connects the source of the first driver transistor DTr1 to the ground voltage line Vss. The damascene layer 5b connects the source of the first load transistor LTr1 to the power voltage line VDD. The damascene layer 5c connects the source of the second access transistor ATr2 to the bit line BL#. The damascene layer 5d connects the gate of the first access transistor ATr1 to the word line WL. The damascene layer 5e is a L-shaped tungsten damascene node which is connected to the drain of the first access transistor ATr1, the drain of the first driver transistor DTr1, the drain of the first load transistor LTr1 and each of the gates of the second load transistor LTr2 and the second driver transistor DTr2, and then is connected to the gate interconnection 4d. The damascene layer 5f is a L-shaped tungsten damascene node which is connected to the drain of the second access transistor ATr2, the drain of the second driver transistor DTr2, the drain of the second load transistor LTr2 and each of the gates of the first load transistor LTr1 and the first driver transistor DTr1, and then is connected to the gate interconnection 4a. The damascene layer 5g connects the gate of the second access transistor ATr2 to the word line WL. The damascene layer 5h connects the source of the first access transistor ATr1 to the bit line BL. The damascene layer 5i connects the source of the second load transistor LTr2 to the power voltage line VDD. The damascene layer 5j connects the source of the second driver transistor DTr2 to the ground voltage line Vss. The damascene layers 5a–5d and 5g–5j other than the damascene layers 5e and 5f are common with the neighboring memory cell (not shown).

Figure 2C:
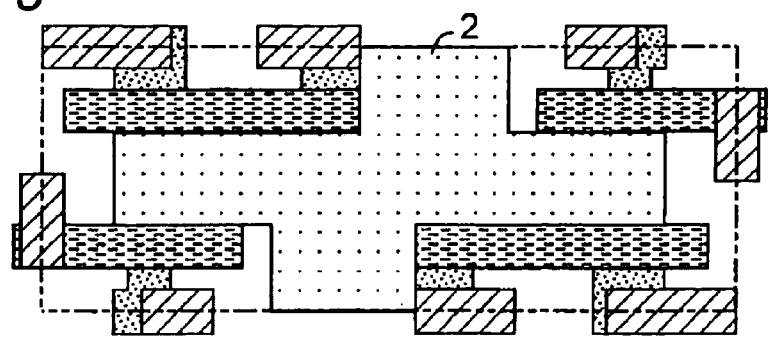

FIG. 2C shows the third layer from the lowermost layer of the memory cell 1. As shown in FIG. 2C, this layer of the memory cell 1 is provided with a capacity plate 2 (cell plate). This capacity plate 2 is formed directly on the both nodes ND1 and ND2 and adds capacity to the both nodes ND1 and ND2. The capacity plate 2 is composed of a capacitive conductive film 11 (see FIG. 4B) and a capacitive insulating film 12 (see FIG. 4B), wherein the both films 11 and 12 have the same shapes. In the forming process of the capacity plate 2, the capacitive insulating film 12 is first formed, and then the capacitive conductive film 11 is next formed directly on the capacitive insulating film 12. A sufficient margin is taken for the capacitive conductive film 11 so as not to contact with the damascene layers 5a, 5c, 5d, 5g, 5h and 5j. In this way, a capacity is formed directly on the nodes ND1 and ND2 by means of a stacked structure including the nodes ND1 and ND2, the capacitive insulating film 12 and the capacitive conductive film 11.

Figure 3A:
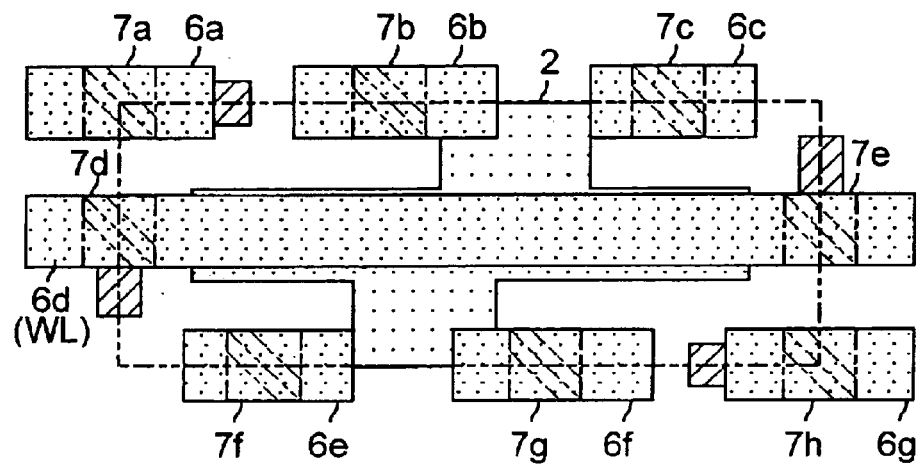
FIGS. 3A and 3B are plan views showing the structures of the fourth layer from the lower side and the uppermost layer of the memory cell shown in FIG. 1A, respectively.

FIG. 3A shows the fourth layer from the lowermost layer of the memory cell 1. As shown in FIG. 3A, this layer of the memory cell 1 is provided with seven first-layer metal interconnections 6a–6g which extend in the row direction. The first-layer metal interconnection 6d forms the word line WL. At the rear portion of the memory cell 1, a stacked via contact 7a for connecting the first-layer metal interconnection 6a to the damascene layer 5a is provided near the first-layer metal interconnection 6a for connection with the ground line Vss. A stacked via contact 7b for connecting the first-layer metal interconnection 6b to the damascene layer 5*b* is provided near the first-layer metal interconnection 6*b* for connection with the power voltage line VDD. A stacked via contact 7*c* for connecting the first-layer metal interconnection 6*c* to the damascene layer 5*c* is provided near the first-layer metal interconnection 6*c* for connection with the bit line BL#.

At a middle portion of the memory cell 1 in the front-rear view, a stacked via contact 7*d* for connecting the first-layer metal interconnection 6*d* to the damascene layer 5*d* at the left side and a stacked via contact 7*e* for connecting the first-layer metal interconnection 6*d* to the damascene layer 5*g* at the right side are provided near the first-layer metal interconnection 6*d*.

At the front portion of the memory cell 1, a stacked via contact 7*f* for connecting the first-layer metal interconnection 6*e* to the damascene layer 5*h* is provided for connection with the bit line BL near the first-layer metal interconnection 6*e*. A stacked via contact 7*g* for connecting the first-layer metal interconnection 6*f* to the damascene layer 5*i* is provided for connection with the power voltage line VDD near the first-layer metal interconnection 6*f*. A stacked via contact 7*h* for connecting the first-layer metal interconnection 6*g* to the damascene layer 5*j* is provided for connection with the ground voltage line Vss near the first-layer metal interconnection 6*g*. The first-layer metal interconnections 6*a*–6*g* and the stacked via contacts 7*a*–7*h* are common with the neighboring memory cell (not shown). Moreover, the first-layer metal interconnection 6*d*, that is to say, the word line WL is connected in the row direction.

Figure 3B:
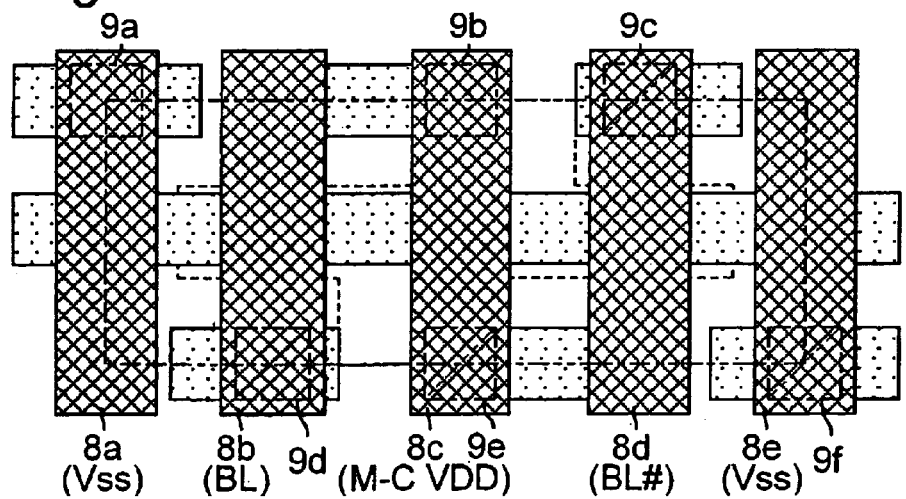

FIG. 3B shows the uppermost layer (fifth layer from the lower side) of the memory cell 1. As shown in FIG. 3B, this layer of the memory cell 1 is provided with five second-layer metal interconnections 8*a*–8*e* which extend in the column direction. These second-layer metal interconnections 8*a*–8*e* form the left side ground voltage line Vss, the bit line BL, the power voltage line VDD (M-C VDD), the bit line BL# and the right side ground voltage line Vss.

Hereupon, a via contact 9*a* for connecting the second-layer metal interconnection 8*a* (Vss) to the first-layer metal interconnection 6*a* is provided near the second-layer metal interconnection 8*a*. A via contact 9*d* for connecting the second-layer metal interconnection 8*b* (BL) to the first-layer metal interconnection 6*e* is provided near the second-layer metal interconnection 8*b*. Via contacts 9*b* and 9*e* which connect the second-layer metal interconnection 8*c* (VDD) to the first-layer metal interconnections 6*b* and 6*f* respectively are provided near the second-layer metal interconnection 8*c*. A via contact 9*c* for connecting the second-layer metal interconnection 8*d* (BL#) to the first-layer metal interconnection 6*c* is provided near the second-layer metal interconnection 8*d*. A via contact 9*f* for connecting the second-layer metal interconnection 8*e* (Vss) to the first-layer metal interconnection 6*g* is provided near the second-layer metal interconnection 8*e*. The second-layer metal interconnections 8*a*–8*e* are connected to the memory cell (not shown) neighboring in the column direction. Moreover, the via contacts 9*a*–9*f* are common with the surrounding memory cells (not shown).

The memory cell 1 having the above-mentioned structure is two-dimensionally arranged in the row direction and in the column direction, and thereby the CMOS-SRAM, in which a capacity for a soft error measure according to the present invention is added, is constituted. The constitution and the function of the CMOS-SRAM will be now described.

Figure 4A:
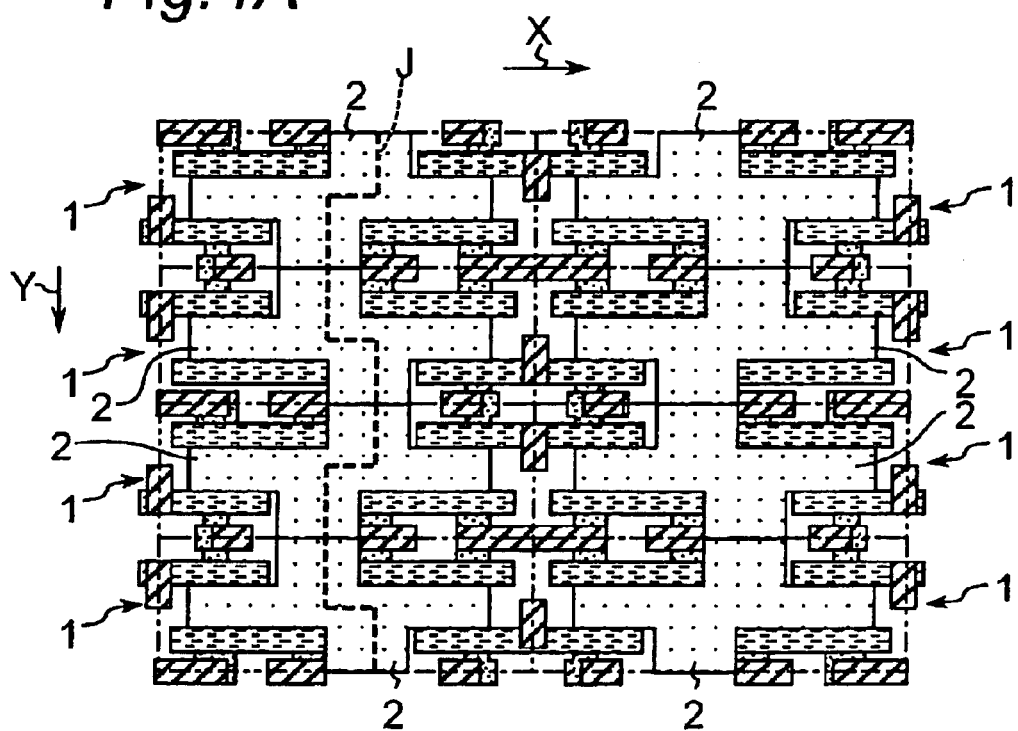
Figure 4B:
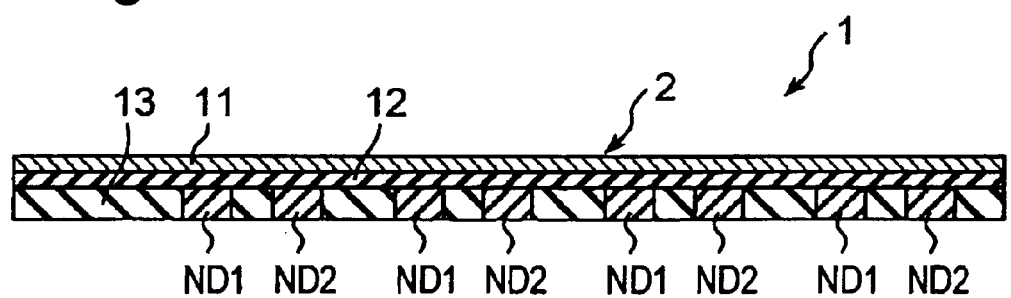
FIG. 4B is a sectional elevation view of the CMOS-SRAM taken along a polygonal line J shown in FIG. 4A.
Figure 5A:
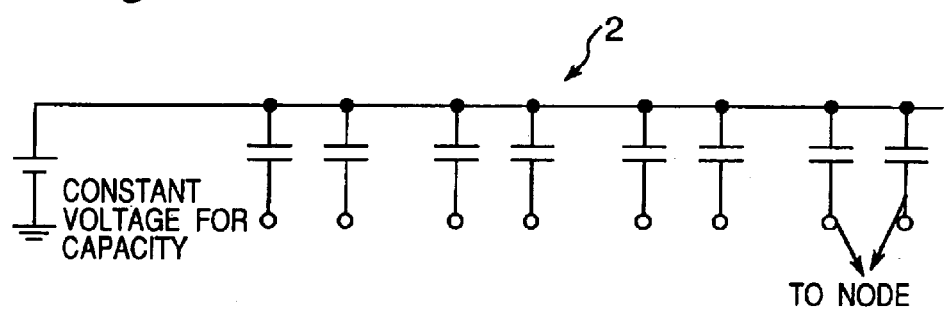

FIG. 4A is a plan view of the CMOS-SRAM (2×4 layout) in which eight memory cells 1 are two-dimensionally arranged so that two memory cells 1 are arranged in the row direction and four memory cells 1 are arranged in the column direction. FIG. 4B is a sectional elevation view of the CMOS-SRAM taken on a polygonal line J shown in FIG. 4A and approximately cut in the column direction. FIG. 5A shows an equivalent circuit diagram of the CMOS-SRAM shown in FIG. 4A or 4B.

As shown in FIGS. 4A, 4B and 5A, in this CMOS-SRAM, the capacity plate 2 of each memory cell 1 is connected in the column direction, that is to say, in the direction shown by the arrow Y in FIG. 4A. Namely, with respect to the plurality of memory cells 1 which line up in the column direction, the capacity plate 2 is common or is shared. In other words, the capacity plate 2 is provided by one by the column substantially. However, the capacity plate 2 of each memory cell 1 is not connected in the row direction, that is to say, in the direction shown by the arrow X in FIG. 4A. Namely, the capacity plates 2 which neighbor in the row direction are independent (separate) to each other.

The capacity plate 2 is connected to the both nodes ND1 and ND2 which are memory hold sections of each memory cell 1 forming the CMOS-SRAM. Each of the nodes ND1 and ND2 is certainly insulated to each other by means of an interlayer film 13. The capacity insulating film 12 is arranged directly on each of the nodes ND1 and ND2 while the capacitive conductive film 11 is formed directly on the capacity insulating film 12. Namely, the capacity plate 2 has a two-layers structure in which the capacity conductive film 11 and the capacity insulating film 12 are stacked. The capacity plate 2 causes increase of the capacity of the nodes ND1 and ND2.

Hereupon, in order to make the capacity plate 2 function as a capacity, it is necessary to apply the constant voltage (for example, VDD, GND etc.) to the capacitive conductive film 11. Therefore, the capacitive conductive film 11 is connected to a predetermined power source for applying the constant voltage. In this CMOS-SRAM, as described above, since the capacity plate 2 is common with respect to the plurality of memory cells 1 which line up in the column direction, the connection of the capacitive conductive film 11 to the power source for applying the constant voltage is only one for the plurality of memory cells 1 in the same column. Accordingly, the interconnection structure (for example, contact) for supplying the constant voltage to the capacity plate 2 or the manufacturing process therefor can be simplified. Moreover, the yield can be also increased.

Figure 5B:
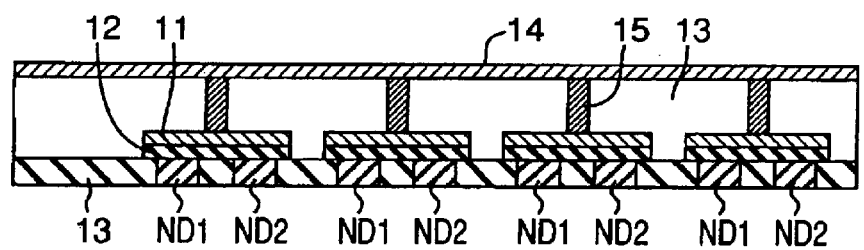
FIG. 5B is a sectional elevation view of a CMOS-SRAM in which capacity plates are not connected in the column direction.

For example, as shown in FIG. 5B, in the case where the capacity plates 2 (the capacity conductive film 11) are not connected in the column direction, it is necessary to supply the constant voltage to the capacitive conductive film 11 of the capacity plate 2 of each memory cell 1 individually. Therefore, it is necessary to provide an interconnection 14 for capacity and a number of contacts 15, thereby the interconnection structure for supplying the constant voltage to the capacity plate 2 would become very complex. Thus, it causes deterioration of the yield and it becomes difficult to constitute the redundant memory cell.

In this way, in the CMOS-SRAM or the memory cell 1 according to Embodiment 1, the capacity plate 2 is provided at the upper side of the node connection interconnection. Therefor, the capacity for the soft error measures can be formed without increase of the memory size. Hereupon, in the case where the electric potential applied to the capacitive conductive film 11 of the capacity plate 2 formed directly on the nodes ND1 and ND2 is set at the source potential VDD of the both load transistors LTr1 and LTr2, it is not necessary to take the margin between the damascene layers 5*b* and 5*i* for connection with the power voltage line VDD formed directly on the source and the capacity plate 2. Therefore, the capacity plate 2 can be formed largely, thereby a greater capacity can be obtained. Accordingly, the capacity can be easily added without increase of the area of the memory cell, thereby the CMOS-SRAM, which is strong against the soft error, can be obtained.

In the case where the electric potential applied to the capacitive conductive film 11 of the capacity plate 2 is set at the potential which is different from that of the power voltage line VDD, for example, that of the ground voltage line Vss (GND), the possibility that the capacitive conductive film 11 short-circuits with the power voltage line VDD becomes larger. Therefore, it is necessary to expand the distance between the both damascene layers 5b and 5i and the capacity plate 2. In this case, since the voltage of the capacitive conductive film 11 of the capacity plate 2 is the ground voltage Vss, it is not necessary to take a margin between the capacity plate 2 and the damascene layers 5a and 5j. Therefore, capacity can be easily added without increase of the area of the memory cell, thereby the CMOS-SRAM which is strong against the soft error can be obtained.

As described above, in accordance with the CMOS-SRAM (the semiconductor memory device) according to Embodiment 1, even if the quantity of electric charge for holding memory is small due to decrease of the operating voltage of the IC or integration of the IC etc., occurrence of the soft error may be effectively reduced. In addition, the interconnection structure for supplying the constant voltage to the capacity plate 2 and the manufacturing process therefor may be simplified. Moreover, by replacing the memory cell having a stand-by failure with the redundant memory cell, the stand-by failure may be relieved while the yield may be increased considerably.

(Embodiment 2)

Hereinafter, the CMOS-SRAM (the semiconductor memory device) according to Embodiment 2 of the present invention will be described with reference to FIG. 6 and FIGS. 1A–5B. Since the basic constitution of the CMOS-SRAM or the memory cell thereof in accordance with Embodiment 2 is similar to that of the CMOS-SRAM or the memory cell thereof in accordance with Embodiment 1 shown in FIGS. 1A–5B, in order to avoid repeated descriptions, points which are different from Embodiment 1 will be mainly described below. Reference numerals identical with the case of Embodiment 1 are added to components common with Embodiment 1 in Embodiment 2 shown in FIG. 6.

Figure 6:
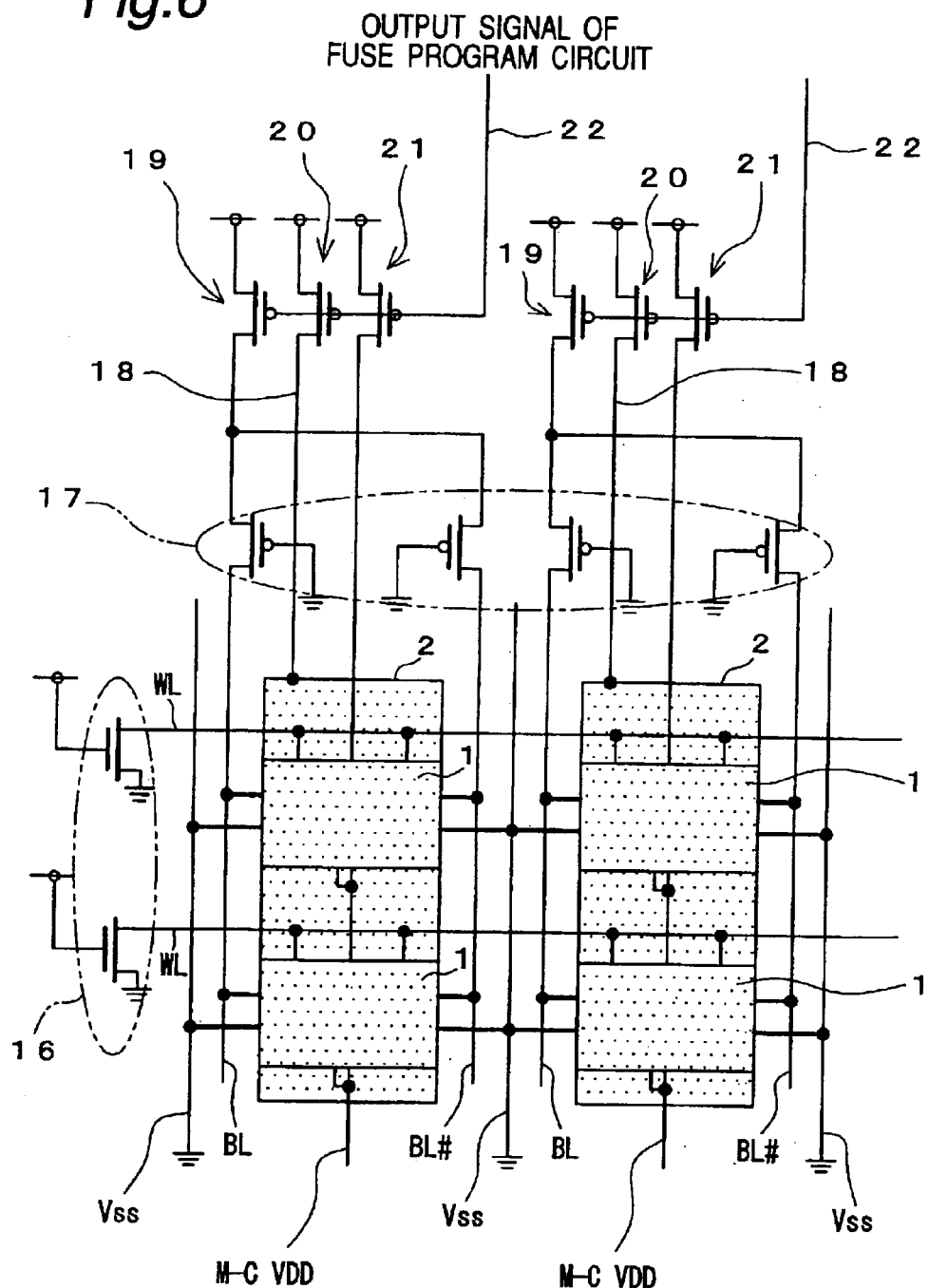
FIG. 6 is a circuit diagram of a CMOS-SRAM according to Embodiment 2 of the present invention.

As shown in FIG. 6, the CMOS-SRAM in accordance with Embodiment 2 is such that the capacitive conductive film 11 of the capacity plate 2 which is common with the plurality of memory cells 1 lining up in the column direction, is connected to the power voltage line VDD, thereby the capacity plate 2 adds a capacity for the soft error measures to the nodes ND1 and ND2. The CMOS-SRAM is provided with a redundant memory cell (not shown) for replacement with a failed memory cell 1 in order to improve the yield. Thus, when a failed memory cell 1 is found in the CMOS-SRAM, the memory cell 1 is replaced with the redundant memory cell. The method of replacing the failed memory cell 1 with the redundant memory cell will be described later.

Moreover, in the CMOS-SRAM, the power voltage line M-CVDD, the ground voltage line Vss (GND) and the capacity plate 2 are arranged so as to extend in the direction parallel with the bit lines BL and BL#. On the other hand, the word line WL is arranged so as to extend in the direction perpendicular to the bit lines BL and BL#. The capacity plates 2 are not connected to one another in the row direction (namely, separated by every column). Further, there are provided a word line driver 16 for switching each of the word lines WL, and a bit line driver 17 for switching each of the bit lines BL and BL#. The word line driver 16 is simply shown in the form of an NMOS, in which a word line pull-up device is omitted. In the word line driver 16, at the time of stand-by, the gate signal of the NMOS is the power voltage (VDD voltage). Moreover, the bit line driver 17 is also simply shown in the form of a PMOS. In this bit line driver 17, at the time of stand-by, the gate signal of the PMOS is the ground voltage (Vss voltage).

In the bit lines BL and BL#, a plate connecting line 18 for connecting the capacitive conductive film 11 of the capacity plate 2 to the power voltage line VDD, and the power voltage line M-CVDD, there are interposed a switch 19 for bit line load composed of a p type MOS transistor, a switch 20 for the cell plate, and a switch 21 for M-CVVD, respectively. These switches are controlled by means of a fuse program output signal, which is applied via a fuse program signal line 22. A control signal for the three switches 19–21 is common.

Thus, in this CMOS-SRAM, when a stand-by failure occurs in the memory cells 1 lining up in the column direction, the capacitive conductive film 11 of the capacity plate 2 is connected to the power voltage line VDD, and then the memory cell 1 is switched by means of the cell redundant signal to be replaced with the redundancy memory cell. Hereinafter, a method of detecting the stand-by failure or a method of replacing the failed memory cell 1 with the redundant column (redundant memory cell) will be describe with respect to the case the of stand-by failure.

At first, the outline of the method of detecting the stand-by failure or the method of replacing the failed memory cell 1 with the redundant column (the redundant memory cell) will be describe below.

At the time of a test mode, in the case where the switch circuits are all set at nonconductive states, if there is a memory cell 1 having a stand-by current failure within an array of the column direction of the memory cells 1 (hereinafter referred to "memory cell array 1"), the voltage of the power voltage line M-CVDD is lowered due to its leak current. Accordingly, by detecting this lowered voltage, the memory cell array 1 having the stand-by current failure may be detected. When the voltage level of the power voltage line M-CVDD becomes the ground voltage level, memory data of the memory cell 1 corresponding to the above disappear so that the memory cell 1 becomes an operation failure state. Then, by reading out the data of the memory cell 1 and judging whether the stored data of the memory cell 1 is different from the written test data (or whether the normal data can be read out or not), the failed memory cell array 1 or the failed memory cell 1 can be specified.

After the memory cell array 1 having the stand-by current failure is specified, a fuse program circuit (not shown) is programmed, and then the power voltage line M-CVDD corresponding to the failed memory cell array 1 is separated from the power node. In this way, by certainly detecting the memory cell array 1 of stand-by current failure/normal operation and separating the corresponding power voltage line M-CVDD from the power node, the memory cell array 1 of stand-by current failure/normal operation can be relieved by means of the redundant replacement so that the stand-by current can be reduced.

Figure 7:
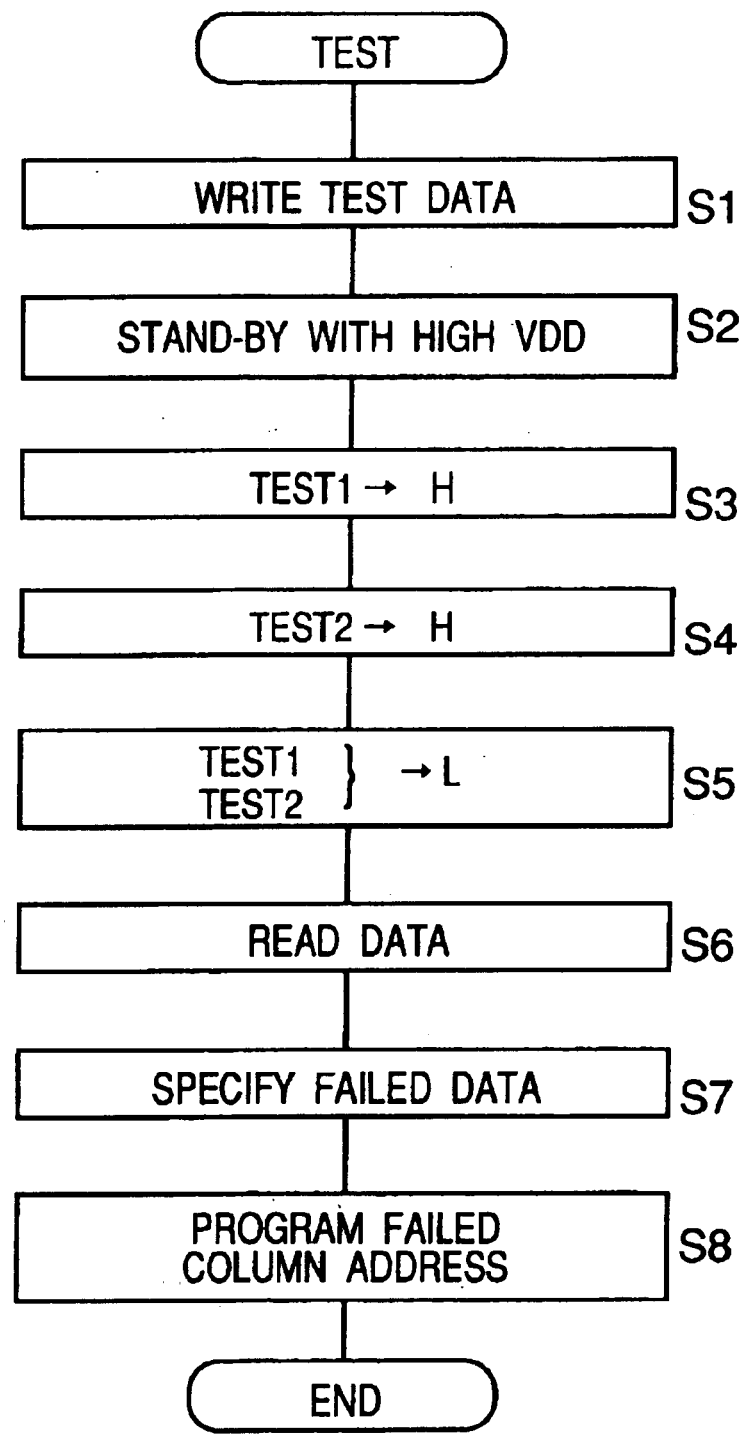
FIG. 7 is a flowchart showing a method of detecting a memory cell having a stand-by failure and a method of replacing the memory cell to a redundant memory cell.

Hereinafter, the method of detecting the stand-by failure or the method of replacing the failed memory cell to the redundant memory cell will be specifically described with reference to the flowchart shown in FIG. 7.

At first, a test data is written in each memory cell of the memory cell array 1 with the power voltage of the voltage level in the normally used state (Step S1). After writing of test data to the memory cell 1 have been completed, the power voltage (VDD voltage) is held at a state higher than the normally used state, and then the memory cell array 1 is made a stand-by state (Step S2).

These operations are conducted by adjusting the level of the power voltage which is applied from an outer tester (not shown) to a power terminal. Moreover, by raising the power voltage (the VDD voltage) above the normally used state, the existence of the memory cell array 1 or the memory cell 1 of stand-by current failure/normal operation becomes pronounced.

Next, a test mode indicating signal TEST1 is set at H level, and then the power voltage line M-CVDD is separated from the power node (Step 3). When the memory cell 1 having the stand-by current failure is connected to the power voltage line M-CVDD, the voltage level of the power voltage line M-CVDD is lowered.

Then, the test mode indicating signal TEST2 is set at H level, and then the voltage level of the power voltage line M-CVDD is detected to set the voltage level of the corresponding power voltage line in accordance with the detected result (Step S4). Namely, the voltage level of the power voltage line M-CVDD whose voltage level is lowered by means of an abnormal stand-by current is set at the ground voltage level. Then, the both test mode indicating signals TEST1 and TEST2 are set at L levels so that the memory cell 1 having the stand-by current failure becomes pronounced to complete the operation step to make it operation failure state (Step S5). Since the ground voltage is supplied to the power node of the memory cell 1 having the stand-by current failure, the stored data have disappeared. Next, the stored data of the memory cell is read out sequentially (Step S6).

When the data read out from the memory cell is different from the written test data, the address (column address) of this failed memory cell 1 is specified (Step S7). In the stored data of this memory cell 1, the memory nodes thereof are L levels together so that the data to be read out become undefined. Hereupon, the address of the memory cell 1, in which an operation failure occurs, is detected at the time of the test mode in which the operation failure, is detected. Then, the identification of the memory cell 1 of stand-by current failure/normal operation and that of operation failure may be made. Because the memory cell 1 of operation failure does not always cause the stand-by current failure.

After the failed memory cell 1 is specified in Step S7, the column address (hereinafter referred to "failure column address") of the failed memory cell 1 is programmed, and a link element in the program circuit corresponding to the failed memory cell 1 is fused in the program circuit. Thus, the power voltage line M-CVDD connected to the memory cell 1 having the stand-by current failure is separated from the power node.

Therefore, it may be prevented that the memory cell 1 having the stand-by current failure causes an abnormal stand-by leak current at the time of the normal operation mode. The failure column address is used, since the power voltage line M-CVDD extends in the column direction and the power voltage line M-CVDD is arranged in accordance with each memory cell array 1. With respect to the memory cell array 1 or the memory cell 1 of operation failure, separating of the corresponding power voltage line M-CVDD from the power node may be made regardless of abnormal/normal of stand-by current.

Then, the memory cell array 1 or the memory cell 1 of stand-by current failure/operation normal is replaced with the redundant memory cell by means of the prpgram of the failed column address in Step S8. In general, a switch gate is provided in accordance with each memory cell array 1, and then separating of the power voltage line M-CVDD is made by the memory cell array unit. However, a switch gate may be provided with respect to the power voltage line M-CVDD of a plurality of columns. In this case, replacement relief of the memory cell 1 having the stand-by current failure is made by the plurality of columns unit.

In the Step 6, it is also desirable that the test mode indicating signals TEST1 and TEST2 are held at active states when the data of the memory cell 1 is read out. Namely, it is also desirable that data of the memory cell 1 is read out with the voltage of the power voltage line M-CVDD latched by a detecting and holding circuit (not shown).

In this way, the power voltage line M-CVDD extending in the column direction is separated from the source node at the time of the test mode, and then the voltage level of the power voltage line M-CVDD is detected. Then, when the voltage level of the power voltage line M-CVDD has been lowered, the power voltage line M-CVDD is set at the ground voltage level, thereby the memory cell array 1 or the memory cell 1 having the stand-by current failure can be set at the operation failure state certainly. Thus, the memory cell array 1 or the memory cell 1 of stand-by current failure/operation normal can be set at the operation failure state, thereby this column address can be easily specified. Moreover, by separating the power voltage line M-CVDD from the power node, the failure of the stand-by current can be relieved certainly.

Namely, in the CMOS-SRAM having the above-mentioned constitution, for example, when a stand-by failure is found in the certain column, the fuse program signal becomes H level. Thus, the switches 19, 20 and 21 are turned off, thereby the stand-by current do not flow in the memory cell 1 of its column to replace with the redundant column (the redundant memory cell). Accordingly, the stand-by failure in the column or failure with respect to the capacity plate 2 by the following causes can be relieved.

(1) A short circuit between one node ND1 (ND2) and the other node ND2 (ND1).
(2) A short circuit between the node ND1 or ND2 and the power voltage line VDD.
(3) A short circuit between the node ND1 or ND2 and the ground voltage line Vss.
(4) A short circuit between the node ND1 or ND2 and the word line WL.
(5) A short circuit between the node ND1 or ND2 and the bit line BL or BL#.
(6) A short circuit between the bit lines BL or BL# and the word line WL.
(7) A short circuit between the word line WL and the power voltage line VDD.
(8) A short circuit between the bit line BL or BL# and the ground voltage line Vss.
(9) A short circuit between the power voltage line VDD and the ground voltage line Vss.

As described above, in accordance with Embodiment 2, line replacement of the column in which a stand-by failure has occurred to the redundancy column can be easily made by the lump replacement of the bit line BL (BL#), the plate connecting line 18 and the capacity of the power voltage line M-CVDD. Therefore, the memory cell may be replaced with the redundant memory cell easily or simply when a stand-by failure of the memory cell occurs, thereby the yield may be improved.

(Embodiment 3)

Hereinafter, a CMOS-SRAM (semiconductor memory) according to Embodiment 3 of the present invention will be described in detail with reference to FIG. 8 and FIGS. 1A–6. Since the basic constitution of the CMOS-SRAM or the memory cell thereof in accordance with Embodiment 3 is similar to the case of the CMOS-SRAM or the memory cell thereof in accordance with Embodiment 1 or 2, in order to avoid repeated descriptions, points which are different from Embodiment 1 or 2 will be mainly described below. Reference numerals identical with the case of Embodiments 1 or 2 are added to components common with Embodiments 1 or 2 in Embodiment 3 shown in FIG. 8.

Figure 8:
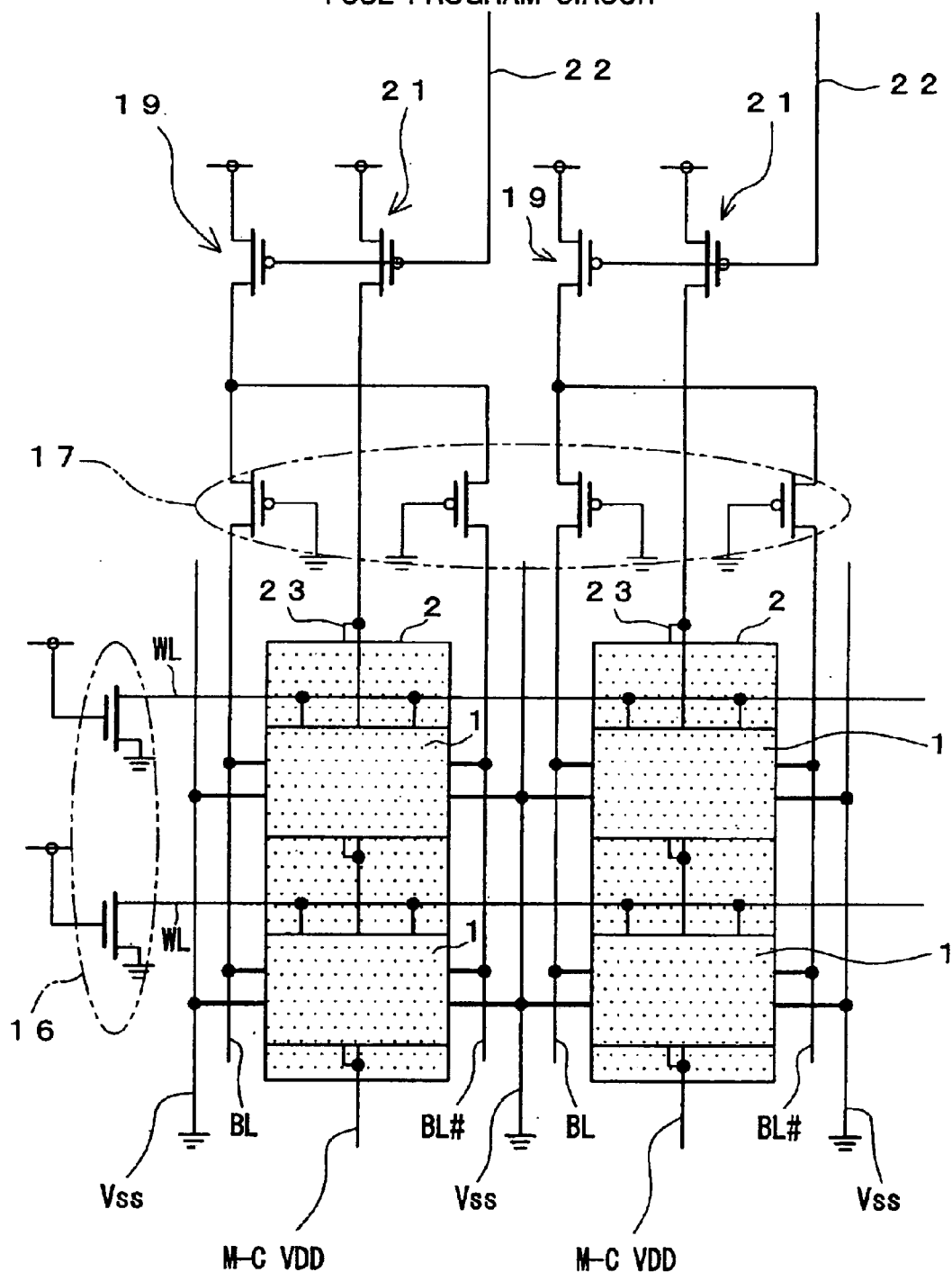
FIG. 8 is a circuit diagram of a CMOS-SRAM according to Embodiment 3 of the present invention.

As shown in FIG. 8, the CMOS-SRAM in accordance with Embodiment 3 is such that the power voltage (VDD) is applied to the capacitive conductive film 11 by connecting the capacitive conductive film 11 of the capacity plate 2 to the power voltage line M-CVDD (sources of the first and second load transistors LTr1 and LTr2) via a very short connecting wire 23. Meanwhile, the switch 20 for the capacity plate 2 of Embodiment 2 shown in FIG. 6 is omitted. Namely, the power voltage line M-CVDD is connected to the capacitive conductive film 11 of the capacity plate 2 while the switch 21 for the line M-CVDD combines with the switch 20 for the cell plate (the switch being common with the capacity plate 2 and the first and second load transistors LTr1 and LTr2). Other constructions are similar to the case of Embodiment 2.

In Embodiment 3 also, like the case of Embodiment 2, line replacement of the column (memory cell) in which a stand-by failure has occurred to the redundant column (the redundancy memory cell) can be easily made by the lump replacement of the bit line BL (BL#), the connecting wire 23 and the power voltage line M-CVDD by means of ON-OFF of the fuse program signal. Therefore, the memory cell may be replaced with the redundant memory cell easily or simply when a stand-by failure of the memory cell 1 occurs, thereby the yield may be improved.

Moreover, since the plate connecting line 18 and the switch 20 for the capacity plate 2 are not necessary, the number of the interconnections and the transistors may be reduced so that the structure of the CMOS-SRAM or the manufacturing process therefor may be simplified. In addition, the floating can be made simultaneously by means of the output signal of the fuse program circuit.

(Embodiment 4)

Hereinafter, a CMOS-SRAM (semiconductor memory device) according to Embodiment 4 of the present invention will be described in detail with reference to FIG. 9, FIGS. 11A and 11B and FIGS. 1A–6. Since the basic constitution of the CMOS-SRAM or the memory cell thereof in accordance with Embodiment 4 is similar to the case of the CMOS-SRAM or the memory cell thereof in accordance with Embodiment 1 or 2, in order to avoid repeated descriptions, points which are different from Embodiment 1 or 2 will be mainly described below. Reference numerals identical with the case of Embodiment 1 or 2 are added to components common with Embodiment 1 or 2 in Embodiment 4 shown in FIG. 9.

Figure 9:
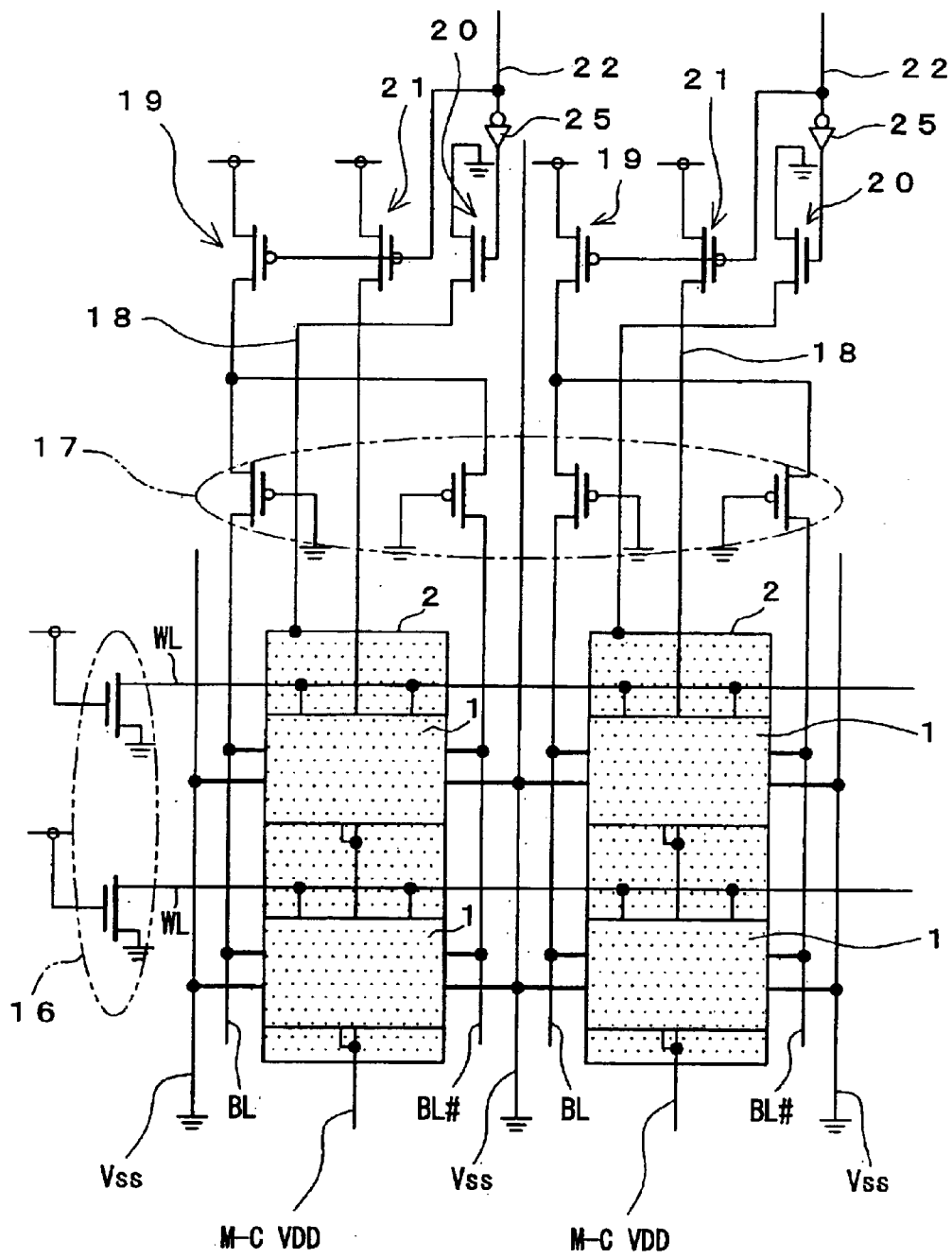
FIG. 9 is a circuit diagram of a CMOS-SRAM according to Embodiment 4 of the present invention.

As shown in FIG. 9, the CMOS-SRAM in accordance with Embodiment 4 is such that the capacitive conductive film 11 of the capacity plate 2, which is common with respect to the plurality of memory cells 1 lining up in the column direction, is connected to the ground voltage line GND, and thereby the capacity plate 2 adds a capacity for the soft error measures to the nodes ND1 and ND2. The fuse program signal line 22 is divided into a branch line for applying the fuse program signal to the switches 19 and 21, and another branch line for applying the fuse program signal to the switch 20. The branch line for the switch 20 is provided with an inverter circuit 25. The switch 20 is an N channel type transistor. Other constructions are similar to the case of Embodiment 2.

In the CMOS-SRAM in accordance with Embodiment 4, the capacitive conductive film 11 of the capacity plate 2 is connected to the ground voltage line GND via the switch 20 which is the N channel transistor so that the film 11 has the ground potential. Accordingly, in the CMOS-SRAM, for example, when a stand-by failure is found in a certain column, the fuse program signal becomes H level. When the fuse program signal is H level, the signal reversed to the L level by the inverter circuit 25 is inputted into the switch 20 so that the switch 20 is turned off. The switches 19 and 21 are turned off like the case of Embodiment 2. Thus, like the case of Embodiment 2, the column (memory cell) is replaced with the redundant column (redundant memory cell). Therefore, the stand-by failure in the column or failure with respect to the capacity plate 2 can be relieved.

By the way, in the CMOS-SRAM in accordance with the present invention, although the capacity plate 2 or the capacitive conductive film 11 is connected in the column direction, it is necessary to separate them in the row direction. In the case where the capacitive conductive film 11 is connected to the ground voltage line GND (Vss) like present Embodiment 4, if the capacity plate 2 or the capacitive conductive film 11 has a shape or layout shown in FIG. 11A, in memory cells 1 which neighbor in the row direction, the capacity plates 2 or the capacitive conductive films 11 are coupled via the damascene layers 5a and 5j in the row direction.

Figure 11A:
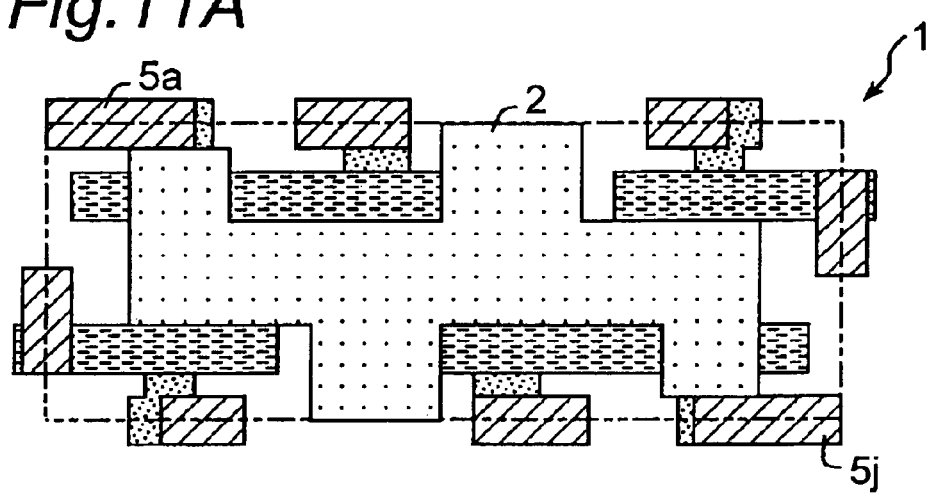
FIGS. 11A and 11B are plan views showing variations of memory cells according to the present invention, respectively
Figure 11B:
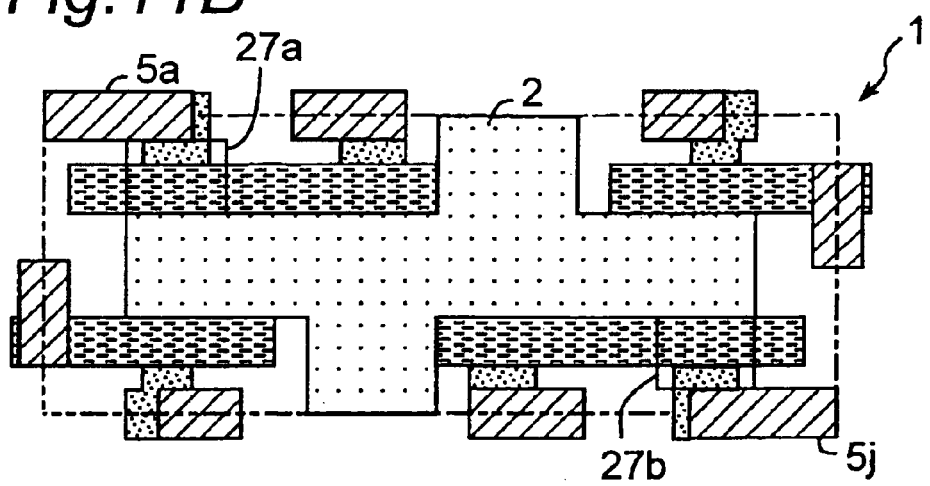
Figure 12A:
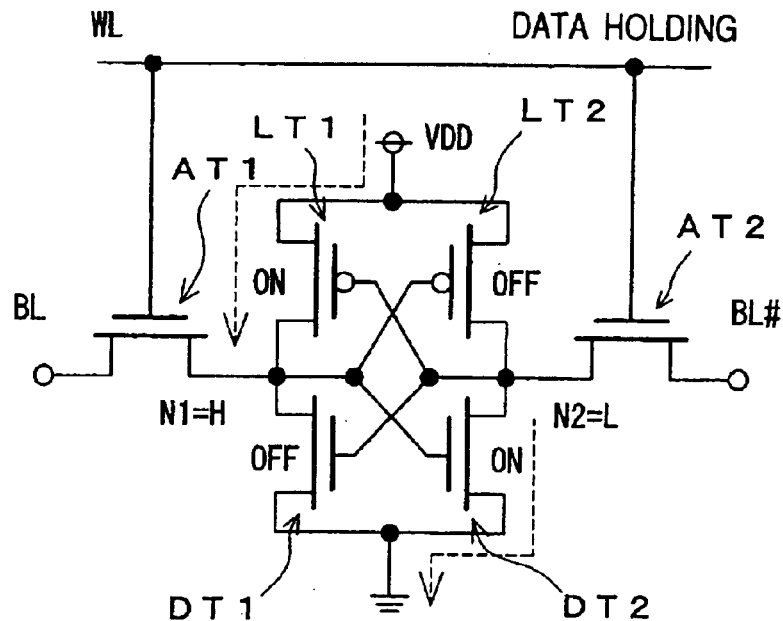
FIGS. 12A and 12B are circuit diagrams of a conventional CMOS-SRAM, respectively.
Figure 12B:
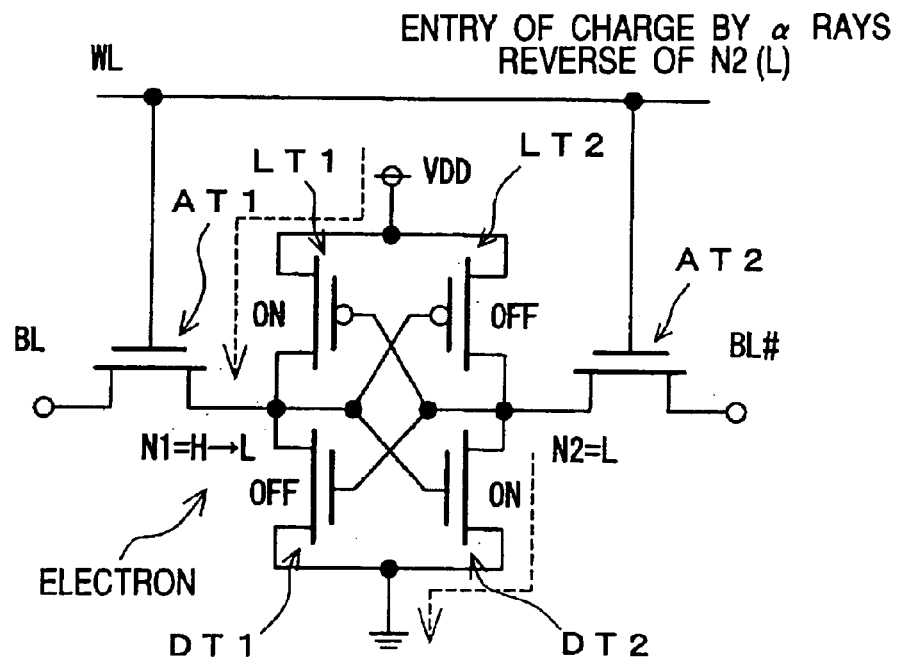
Figure 13A:
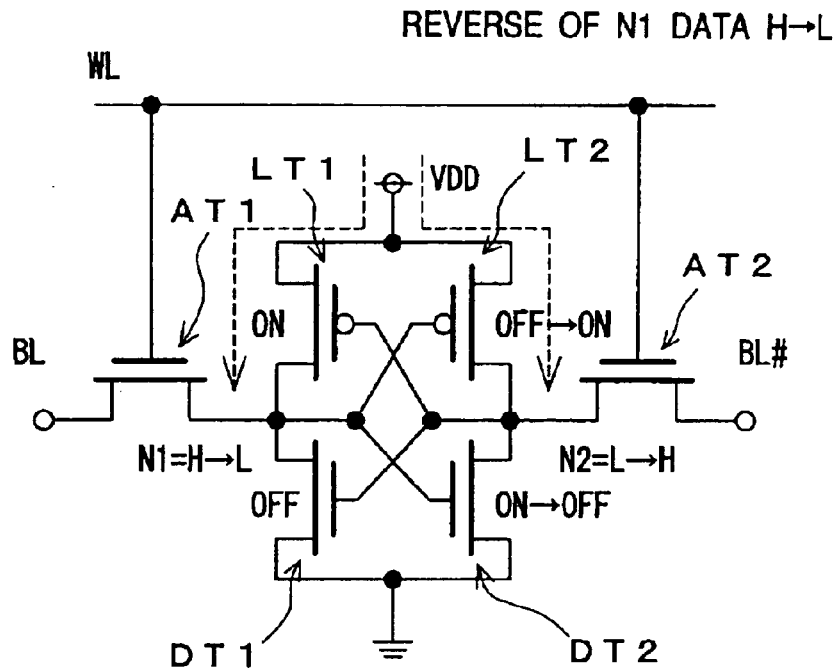
FIGS. 13A and 13B are circuit diagrams of the conventional CMOS-SRAM, respectively.
Figure 13B:
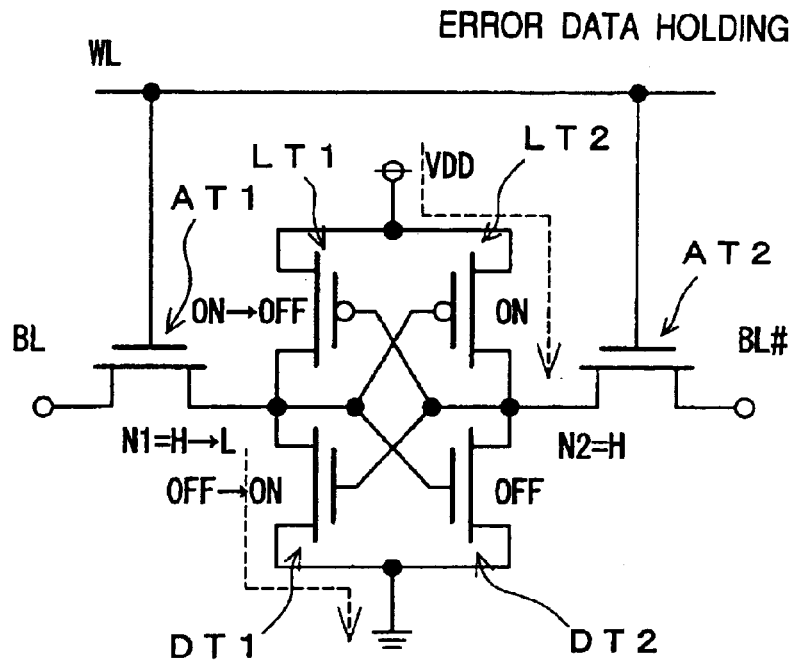

Therefore, as shown in FIG. 11B, it is necessary to take a margin between the capacity plate 2 or the capacitive conductive film 11 and the damascene layers 5a and 5j, for example, by cutting away portions shown by reference numerals 27a and 27b.

Also in Embodiment 4, like the case of Embodiment 2, line replacement of the column (memory cell) in which a stand-by failure have occurred to the redundant column (redundant memory cell) can be easily made by the lump replacement of the bit line BL (BL#), the connecting wire 23 and the power voltage line M-CVDD by means of ON-OFF of the fuse program signal. Therefore, the memory cell may be replaced with the redundant memory cell easily or simply when a stand-by failure of the memory cell 1 occur, thereby the yield may be improved.

(Embodiment 5)

Hereinafter, a CMOS-SRAM (semiconductor memory device) according to Embodiment 5 of the present invention will be described in detail with reference to FIG. 10, FIGS. 1–6 and FIG. 9. Since the basic constitution of the CMOS-SRAM or the memory cell thereof in accordance with Embodiment 5 is similar to the case of the CMOS-SRAM or the memory cell thereof in accordance with Embodiment 1, 2 or 4, in order to avoid repeated descriptions, points which are different from Embodiment 1, 2 or 4 will be mainly described below. Reference numerals identical with the case of Embodiments 1, 2 or 4 are added to components common with Embodiments 1, 2 or 4 in Embodiment 5 shown in FIG. 10.

Figure 10:
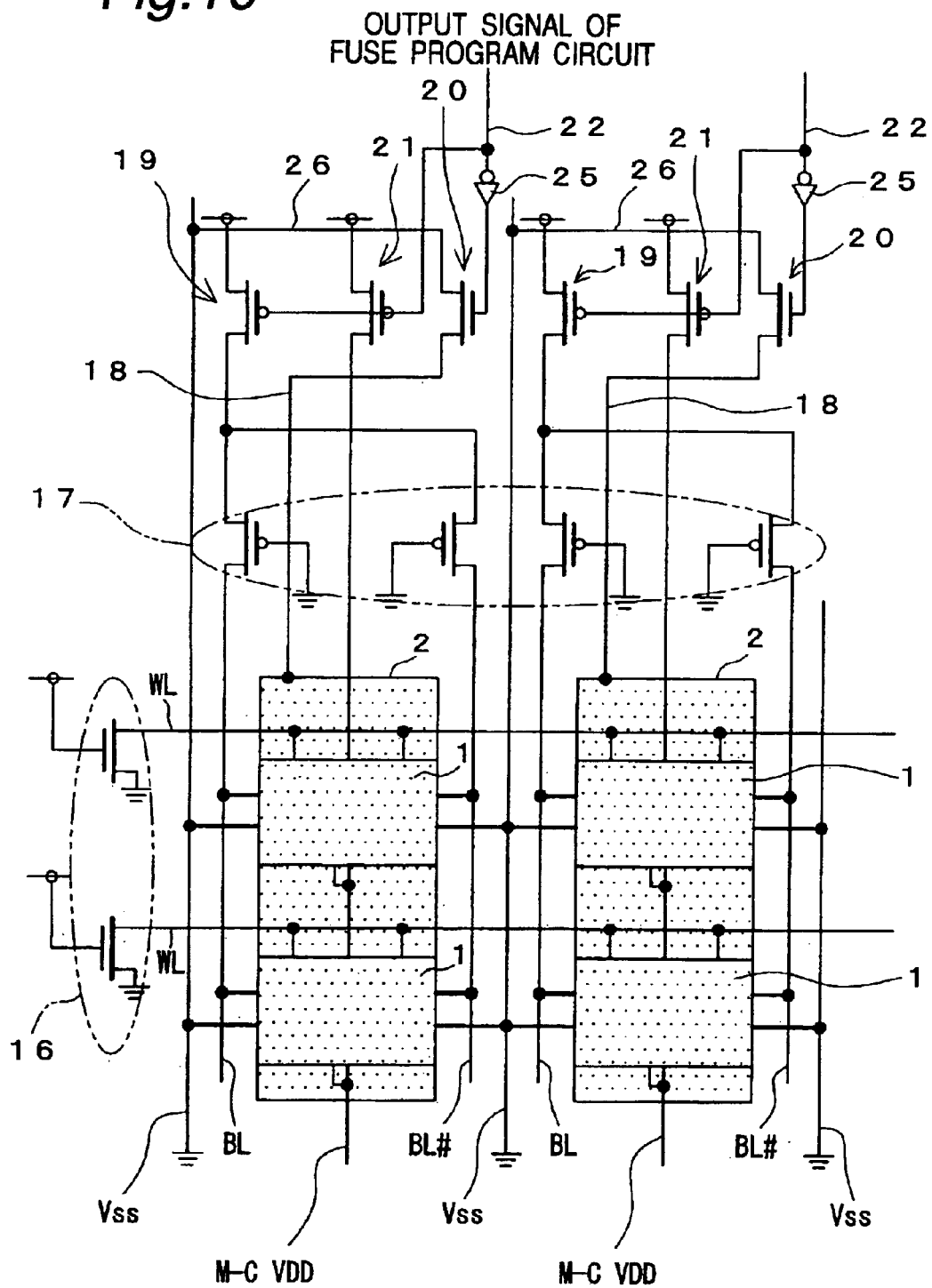
FIG. 10 is a circuit diagram of a CMOS-SRAM according to Embodiment 5 of the present invention.

As shown in FIG. 10, the CMOS-SRAM in accordance with Embodiment 5 is such that the capacitive conductive film 11 is connected to the ground voltage line Vss (GND) by connecting the source of the switch 20 which is the N channel transistor to the ground voltage line Vss (the sources of the first and second driver transistors DTr1 and DTr2) not to the inherent ground voltage section GND via a connecting wire 26. Other constructions are similar to the case of Embodiment 4.

Also in Embodiment 5, like the case of Embodiment 4, line replacement of the column (memory cell) in which a stand-by failure has occurred to the redundant column (redundant memory cell) can be easily made by the lump replacement of the bit line BL (BL#), the plate connecting line 18 and the power voltage line M-CVDD by means of ON-OFF of the fuse program signal. Therefore, the memory cell may be replaced with the redundant memory cell easily or simply when a stand-by failure of the memory cell 1 occur, thereby the yield may be improved.

Moreover, since the special ground voltage section GND for the switch 20 is not necessary, the structure of the CMOS-SRAM or the manufacturing process therefor may be simplified. In addition, the floating can be made simultaneously by means of the output signal of the fuse program circuit.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A semiconductor memory device comprising:
    a memory cell array including a plurality of memory cells each of which comprises a static random access memory, each of said memory cells having a pair of memory nodes, and said memory cells being two-dimensionally arranged in a row direction and in a column direction; and
    a plurality of capacity plates which are disposed so as to face said pair of memory nodes of said respective memory cells, wherein said capacity plates are common with said memory cells lining up in the column direction, the capacity plates being separated from each other in the row direction.

2. The semiconductor memory device according to claim 1, wherein a capacitive conductive film of each said capacity plate is connected to a power voltage section.

3. The semiconductor memory device according to claim 2, in which said pair of memory nodes comprises a first node and a second node, said first node being connected to each of drains of a first driver transistor and a first load transistor and to each of gates of a second driver transistor and a second load transistor, and said second node being connected to each of drains of the second driver transistor and the second load transistor and to each of gates of the first driver transistor and the first load transistor; wherein
    said capacitive conductive film is connected to the power voltage section by connecting said capacitive conductive film to sources of said first and second load transistors.

4. The semiconductor memory device according to claim 1, wherein a capacitive conductive film of said capacity plate is connected to a ground voltage section.

5. The semiconductor memory device according to claim 4, in which said pair of memory nodes comprises a first node and a second node, said first node being connected to each of drains of a first driver transistor and a first load transistor and to each of gates of a second driver transistor and a second load transistor, and said second node being connected to each of drains of the second driver transistor and the second load transistor and to each of gates of the first driver transistor and the first load transistor; wherein
    said capacitive conductive film is connected to the ground voltage section by connecting said capacitive transistors conductive film to sources of said first and second driver transistors.

6. The semiconductor device according to claim 1, wherein row-directional length of a memory cell area of each of said memory cells is larger than column-directional length of the memory cell area.

7. The semiconductor memory device according to claim 1, wherein each of the rows of said memory cells is provided with one word line which extends in the row direction and is connected to access transistors constructing said memory cells, said word line being formed as interconnections on gate electrodes of said memory cells.

8. The semiconductor memory device according to claim 1, wherein each of said memory cells includes a plurality of transistors, said memory device further comprising power voltage lines for supplying power voltage to said plurality of transistors, said power voltage lines being common with said memory cells lining up in the column direction every column, the power voltage lines being separated from each other in the row direction.

9. The semiconductor memory device according to claim 1, further comprising a plurality of switch elements connected between said plurality of capacity plates and a power voltage line or ground voltage line, wherein each of said switch elements is switched every column.

10. A semiconductor memory device comprising:
    a memory cell array including a plurality of memory cells each of which comprises a static random access memory, each of said memory cells having a pair of memory nodes and including a plurality of transistors, and said memory cells being two-dimensionally arranged in a row direction and in a column direction;
    a plurality of capacity plates which are disposed so as to face said pair of memory nodes of said respective memory cells, said capacity plates being common with said memory coils lining up in the column direction; and
    a plurality of switches which electrically connect or disconnect said capacity plates with a power voltage line or ground voltage line by every capacity plate.

11. The semiconductor memory device according to claim 10, wherein each of said capacity plates is connected to a voltage line for supplying a voltage to said transistors of a corresponding memory cell in said column, said capacity plates being connected to said switches through said voltage lines.

12. The semiconductor memory device according to claim 10, further comprising:
    bit lines, each of which is common with said memory cells lining up in the column direction by every column, said bit lines being separated from each other in the row direction; and
    further switches which electrically connect or disconnect said bit lines with said power voltage line, wherein said switches and said further switches are controlled by a common control signal line.

* * * * *